(12) United States Patent
Huai et al.

(10) Patent No.: US 7,009,877 B1
(45) Date of Patent: Mar. 7, 2006

(54) THREE-TERMINAL MAGNETOSTATICALLY COUPLED SPIN TRANSFER-BASED MRAM CELL

(75) Inventors: Yiming Huai, Pleasanton, CA (US); Paul P. Nguyen, San Jose, CA (US); Frank Albert, Redwood City, CA (US)

(73) Assignee: Grandis, Inc., Milpitas, CA (US)

( * ) Notice: Subject to any disclaimer, the term of this patent is extended or adjusted under 35 U.S.C. 154(b) by 97 days.

(21) Appl. No.: 10/714,073

(22) Filed: Nov. 14, 2003

(51) Int. Cl.
*G11C 11/14* (2006.01)

(52) U.S. Cl. .......................................... 365/171; 365/50
(58) Field of Classification Search ................ 365/171, 365/213, 232, 189.04
See application file for complete search history.

(56) References Cited

U.S. PATENT DOCUMENTS

| | | |
|---|---|---|
| 6,532,164 B1 | 3/2003 | Redon et al. |
| 6,865,109 B1 * | 3/2005 | Covington ................... 365/173 |
| 2002/0105827 A1 | 8/2002 | Redon et al. |
| 2003/0007398 A1 | 1/2003 | Daughton et al. |
| 2003/0059588 A1 | 3/2003 | Hannah et al. |
| 2004/0061981 A1 * | 4/2004 | Convington ............. 360/324.1 |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

\* cited by examiner

*Primary Examiner*—Thong Q. Le
(74) *Attorney, Agent, or Firm*—Sawyer Law Group LLP

(57) ABSTRACT

A magnetic memory device for reading and writing a data state comprises at least three terminals including first, second, and third terminals. The magnetic memory device also includes a spin transfer (ST) driven element, disposed between the first terminal and the second terminal, and a readout element, disposed between the second terminal and the third terminal. The ST driven element includes a first free layer, and a readout element includes a second free layer. A magnetization direction of the second free layer in the readout element indicates a data state. A magnetization reversal of the first free layer within the ST driven element magnetostatically causes a magnetization reversal of the second free layer in the readout element, thereby recording the data state.

31 Claims, 16 Drawing Sheets

GL = ground line
BL = bit line
WL = word line

GL = ground line
BL = bit line/middle contact line
WL = word line

THREE-TERMINAL MAGNETOSTATICALLY COUPLED SPIN TRANSFER-BASED MRAM CELL

BACKGROUND

1. Field

The present invention relates generally to magnetic memory systems and, more particularly, to a method and system for providing an element that employs a spin-transfer effect in switching and that can be used in a magnetic memory, such as a magnetic random access memory ("MRAM").

2. Description of the Related Art

Magnetic memories are often used for storing data. One type of memory element currently of interest utilizes magneto-resistance of a magnetic element for storing and reading data. FIGS. 1 and 2 depict conventional magnetic elements 100 and 200.

The conventional magnetic element 100, shown in FIG. 1, is a spin valve (SV) 100 and includes a conventional anti-ferromagnetic (AFM) layer 110, a conventional pinned layer 108, a conventional spacer layer 106, which is typically a conductor, and a conventional free layer 104. The conventional pinned layer 108 and the conventional free layer 104 are ferromagnetic. The conventional spacer layer 106 is nonmagnetic. The AFM layer 110 is used to fix, or pin, the magnetization of the pinned layer 108 in a particular direction. The magnetization of the free layer 104 is free to rotate, typically in response to an external field. Contacts, such as a bottom contact 112 and a top lead 102, can be coupled to the magnetic element 100 to provide electrical contact to the magnetic element 100.

The conventional magnetic element 200, shown in FIG. 2, is a magnetic tunneling junction (MTJ). Portions of the MTJ 200 are analogous to the conventional spin valve 100. Thus, the conventional magnetic element 200 includes an anti-ferromagnetic layer 210, a conventional pinned layer 208, an insulating barrier layer 206, and a free layer 204. The conventional barrier layer 206 is thin enough for electrons to tunnel through in a conventional MTJ 200. Contacts, such as a bottom contact 212 and a top lead 202, can be coupled to the magnetic element 200 to provide electrical contact to the magnetic element 200.

Depending upon the orientations of the magnetizations of the free layer 104 or 204 and the pinned layer 108 or 208, respectively, the resistance of the conventional magnetic element 100 or 200, respectively, changes. When the magnetizations of the free layer 104 and pinned layer 108 are parallel, the resistance of the conventional spin valve 100 is low. When the magnetizations of the free layer 104 and the pinned layer 108 are anti-parallel, the resistance of the conventional spin valve 100 is high. Similarly, when the magnetizations of the free layer 204 and pinned layer 208 are parallel, the resistance of the conventional MTJ 200 is low. When the magnetizations of the free layer 204 and pinned layer 208 are anti-parallel, the resistance of the conventional MTJ 200 is high.

In order to sense the resistance of the conventional magnetic element 100, 200, current is driven through the conventional magnetic element 100, 200. Current can be driven through the conventional magnetic element 100 in one of two configurations, current in plane ("CIP") and current perpendicular to the plane ("CPP"). However, for the conventional magnetic tunneling junction 200, current is driven in the CPP configuration. In the CIP configuration, current is driven parallel to the layers of the conventional spin valve 100. Thus, in the CIP configuration, current is driven from left to right or right to left as seen in FIG. 1. In the CPP configuration, current is driven perpendicular to the layers of conventional magnetic element 100, 200. Thus, in the CPP configuration, current is driven up or down as seen in FIG. 1 or FIG. 2. The CPP configuration is used in MRAM having a conventional magnetic tunneling junction 200 in a memory cell.

Recently, a spin transfer effect has been proposed as a switching mechanism for magnetic memory elements. See J. C. Slonczewski, "Current-driven Excitation of Magnetic Multilayers," *Journal of Magnetism and Magnetic Materials*, vol. 159, p. L1–L5 (1996). In original spin transfer systems, a Co/Cu/Co pseudo-spin valve with current perpendicular to the plane (CPP), similar to that shown in FIG. 1 (but without the AFM layer 210), was used. See L. Berger, "Emission of Spin Waves by a Magnetic Multilayer Traversed by a Current," *Phys. Rev. B*, Vol. 54, p. 9353 (1996), and F. J. Albert, J. A. Katine and R. A. Buhman, "Spin-polarized Current Switching of a Co Thin Film Nanomagnet," *Appl. Phys. Left.*, vol. 77, No. 23, p. 3809–3811 (2000).

However, using such a spin transfer system presents two primary challenges. First, the current required to induce the switching is high, e.g., on the order of 1 mA or greater. Second, the output signal is small, such that both the total resistance and the change in resistance in SV-based spin transfer elements are small, e.g., normally less than 2 Ohms and 5%, respectively.

One proposed method of increasing the output signal is to use a magnetic tunnel junction (MTJ) for the spin transfer device, similar to that shown in FIG. 2. See J. C. Slonczewski, "Current-driven Excitation of Magnetic Multilayers," *Journal of Magnetism and Magnetic Materials*, vol. 159, p. L1–L5 (1996). The magnetic tunnel junction can exhibit large resistance and large signal, e.g., >1000 Ohms and >40% dR/R, respectively. However, this approach still cannot decrease the high operating current sufficiently.

It should be apparent from the discussion above that there is a need for a device and method for providing a magnetic memory element that consumes low power such that it can be used in a high density memory array. Further, there is a need to provide a device and method for protecting sensitive layers of the MTJ from the relatively high write current. The present invention satisfies this need.

SUMMARY

A magnetic memory device for reading and writing a data state comprises at least three terminals including first, second, and third terminals. The magnetic memory device also includes a spin transfer (ST) driven element, disposed between the first terminal and the second terminal, and a readout element, disposed between the second terminal and the third terminal. The ST driven element includes a first free layer, and a readout element includes a second free layer. A magnetization direction of the second free layer in the readout element indicates a data state. A magnetization reversal of the first free layer within the ST driven element magnetostatically causes a magnetization reversal of the second free layer in the readout element, thereby recording the data state. In one embodiment, the ST driven element includes a spin valve (SV). In another embodiment, the readout element includes a magnetic tunnel junction (MTJ).

In another aspect, an array of magnetic memory devices for reading and writing data states is described. The array of magnetic memory devices includes a plurality of word lines, a plurality of bit lines, and a plurality of magnetic memory elements. Each magnetic memory element includes at least first, second, and third terminals; a spin transfer (ST) driven element, disposed between the first terminal and the second terminal; a readout element, disposed between the second terminal and the third terminal; and at least one isolation circuitry configured to select a desired magnetic memory element within the array. The spin transfer (ST) driven element includes a first free layer. The readout element includes a second free layer and an insulating barrier layer. The readout element, the word line, and the bit line cooperate to enable a magnetization direction of the second free layer in the readout element to indicate a data state. The ST driven element, the word line, and the bit line cooperate to enable a magnetization reversal of the first free layer within the ST driven element magnetostatically causing a magnetization reversal of the second free layer in the readout element thereby recording a data state. The isolation circuitry is also used to isolate the insulating barrier layer during a write operation.

In another aspect, a method for reading and writing a data state for a magnetic memory device is described. The method includes providing at least first, second, and third terminals; providing a spin transfer (ST) driven element, disposed between the first terminal and the second terminal; and providing a readout element disposed between the second terminal and the third terminal. The method also includes reversing a magnetization direction of the first free layer within the ST driven element, and magnetostatically causing a magnetization reversal of the second free layer in the readout element to record a data state. The data state is indicated by detecting a magnetization direction of the second free layer in the readout element.

Other features and advantages of the present invention should be apparent from the following description of the preferred embodiment, which illustrates, by way of example, the principles of the invention.

DETAILED DESCRIPTION

Figure 1:
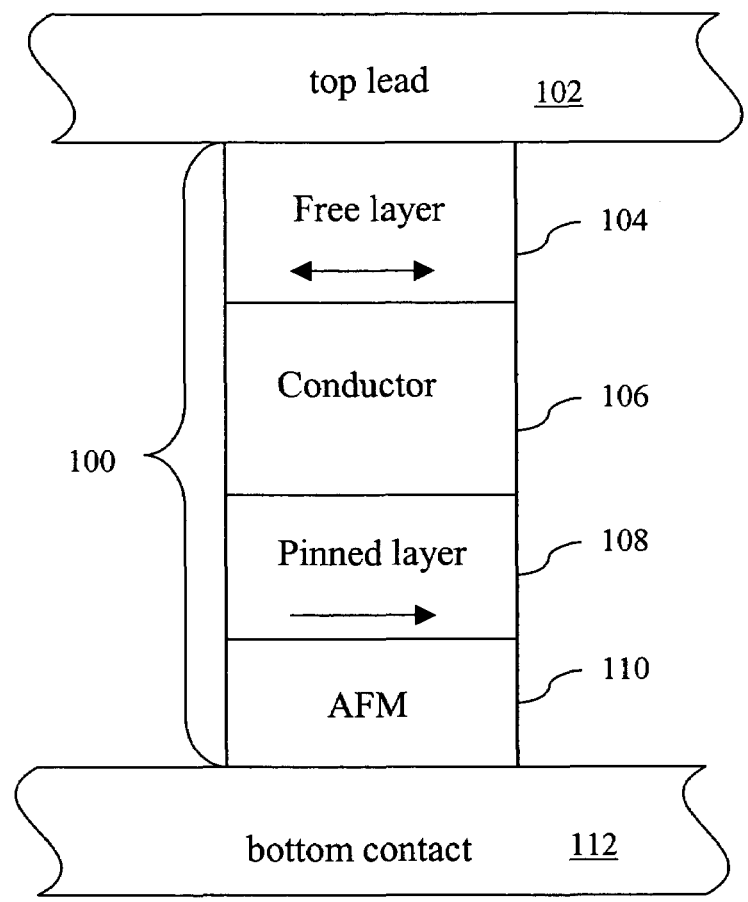
FIG. 1 illustrates a conventional magnetic element configured as a spin valve.
Figure 2:
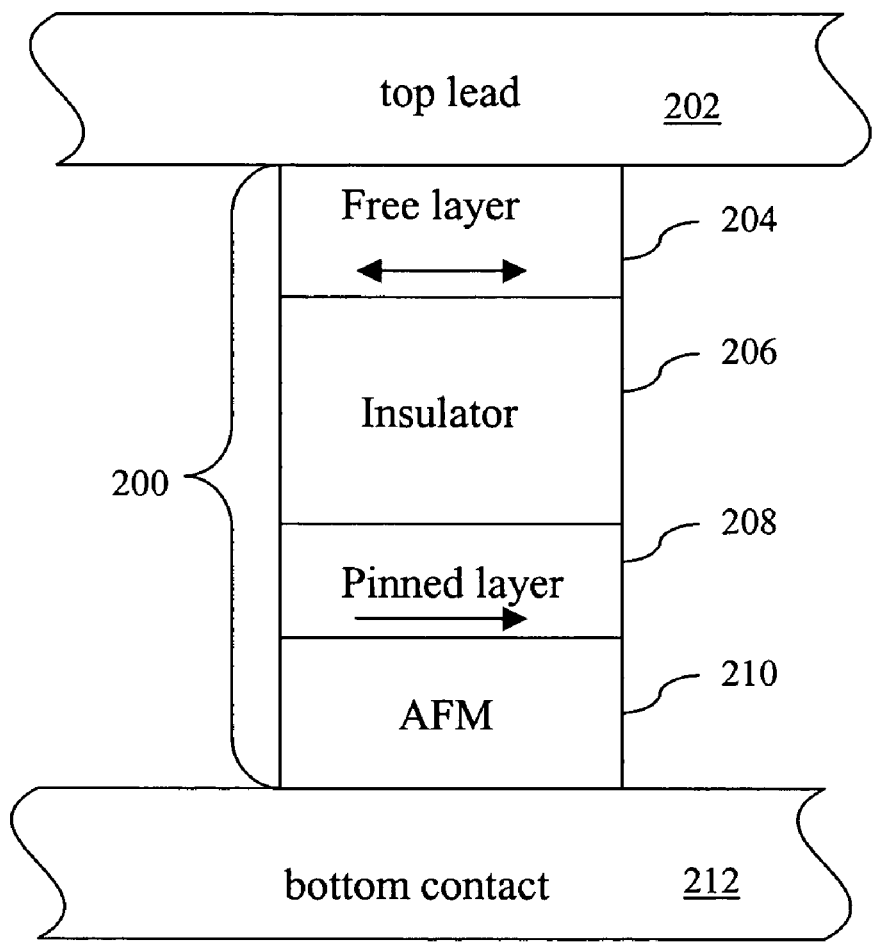
FIG. 2 illustrates a conventional magnetic element configured as a magnetic tunnel junction.
Figure 3:
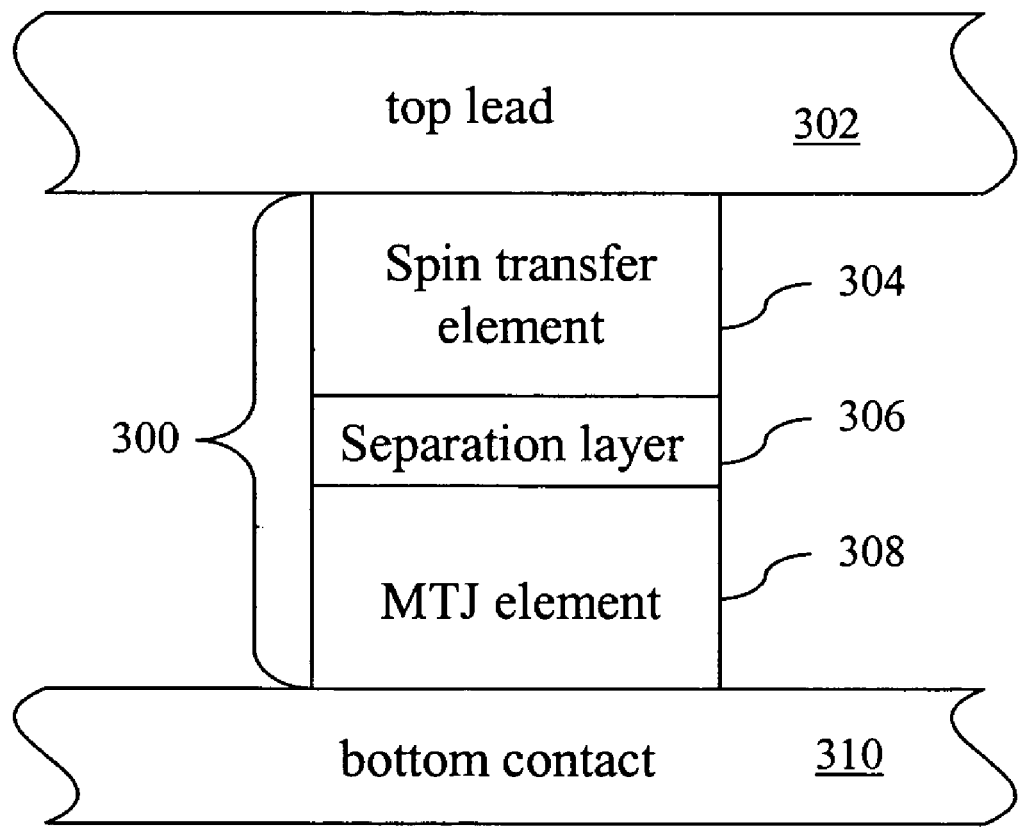
FIG. 3 illustrates a magnetic element configured as a spin valve/magnetic tunnel junction combination.

To overcome the difficulties of the two approaches addressed in FIG. 1 and FIG. 2, another approach is proposed to substantially simultaneously increase the output signal and lower the operating current of the magnetic element by placing the spin transfer element in series with the magnetic tunnel junction (MTJ). One example of the approach is shown in FIG. 3, in which a magnetic element 300 includes a spin transfer driven element (e.g., the spin valve) 304 coupled to a readout element, such as a magnetic tunnel junction (MTJ) element 308, through a separation layer 306. Contacts, such as a bottom contact 310 and a top lead 302, can be coupled to the magnetic element 300 to provide electrical contact to the magnetic element 300. Other layers used to provide the desired structure and properties, such as a seed layer and a capping layer, are not depicted for clarity.

In the magnetic element 300 of FIG. 3, the current causes magnetization reversal of a free layer within the spin transfer element 304. In turn, the magnetic field from this free layer couples magnetostatically with a free layer within the magnetic tunnel junction (MTJ) readout element 308. The free layer in the MTJ readout element 308 responds to this field and undergoes magnetization reversal. For such an approach shown in FIG. 3, the free layer in the spin transfer element 304, which responds to the spin transfer torque, can be optimized for low switching current while the free layer in the MTJ readout element 308 can be optimized for high magnetoresistance.

Figure 4:
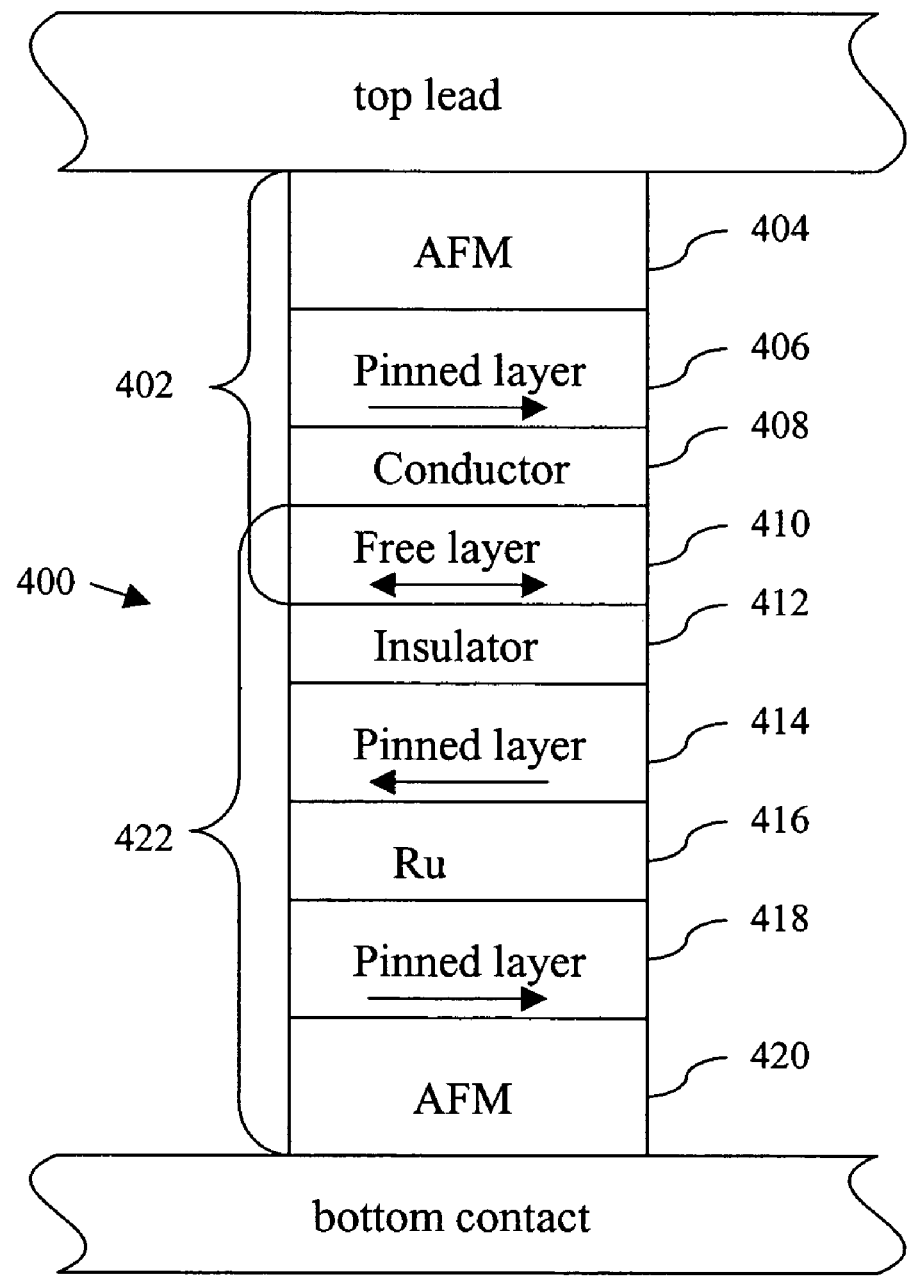
FIG. 4 illustrates a particular embodiment of the magnetic element illustrated in FIG. 3.

FIG. 4 illustrates a particular embodiment of a magnetic element 400, which is substantially similar to the magnetic element 300 shown in FIG. 3. The illustrated magnetic element 400 includes a spin transfer driven element portion (SV) 402 and a magnetic tunnel junction element portion (MTJ) 422. The spin transfer driven element portion 402 comprises an anti-ferromagnetic (AFM) layer 404, a pinned layer 406, a spacer conductor layer 408, and a free layer 410. The magnetic tunnel junction element portion 422 comprises an anti-ferromagnetic layer 420, pinned layers 414, 418, which sandwich a Ruthenium (Ru) layer 416, an insulating barrier layer 412, and a free layer 410. The Ru layer 416, at certain thickness, e.g., between about 5 to 9 Angstroms, promotes anti-ferromagnetic exchange coupling between the two adjacent ferromagnetic films 414, 418. The combination of the three layers 414, 418, 416 form a "synthetic" pinned layer where the non-magnetic layer 416 promotes anti-ferromagnetic exchange coupling between the ferromagnetic pinned layers 414 and 418. Although the particular embodiment of FIG. 4 uses the Ru layer, other equivalent materials can be used instead. Thus, it can be seen that the magnetic element 400 shares the free magnetic layer 410 between the spin transfer driven element portion 402 and the magnetic tunnel junction element portion 422.

Since the free layer 410 experiences torques pointing in the same directions from both the spin transfer driven element 402 and the magnetic tunnel junction element 422, the spin transfer switching current in the magnetic element 400 is lower than the spin transfer switching current in the magnetic element 100 of the case shown in FIG. 1. Therefore, in the illustrated embodiment of FIG. 4, a relatively modest current can switch the magnetization of the free layer 410, where the output signal is dominated by the magnetic tunnel junction element portion 422.

Figure 5:
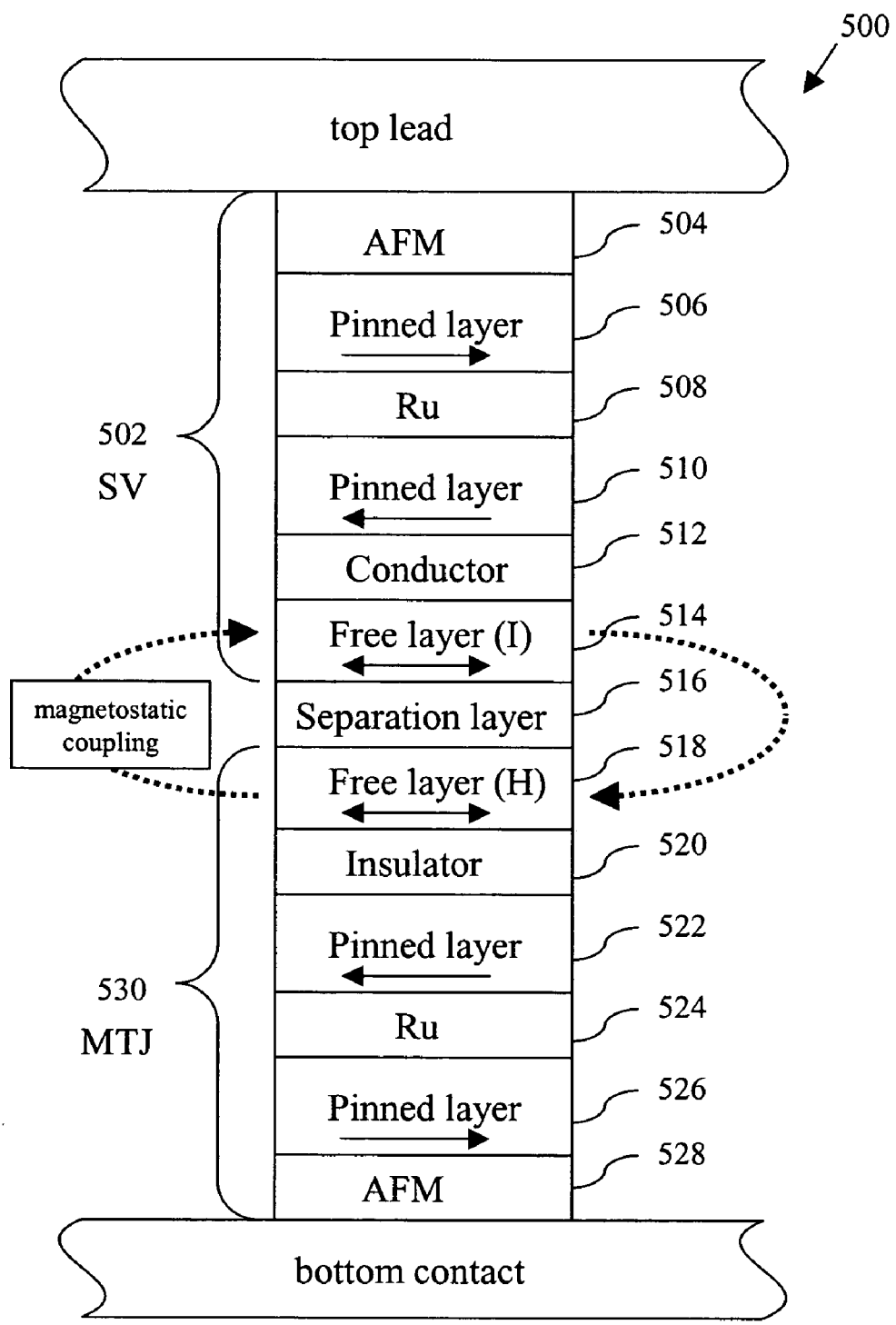
FIG. 5 illustrates another particular embodiment of the magnetic element illustrated in FIG. 3.

FIG. 5 illustrates another particular embodiment of a magnetic element 500, which is substantially similar to the magnetic element 300 shown in FIG. 3. In this embodiment, more than one free layer is used in a combination spin valve/magnetic tunnel junction (MTJ) system, where the free layer(s) of the MTJ element 530 are magnetostatically coupled to the free layer(s) of the spin valve (SV) element 502.

In the FIG. 5 illustrated embodiment, the SV element 502 comprises an anti-ferromagnetic layer 504, a synthetic pinned layer that includes ferromagnetic layers 506 and 510 sandwiching a Ru layer 508, a conducting spacer layer 512, and a free layer (I) 514. The MTJ element 530 comprises an anti-ferromagnetic layer 528, a synthetic pinned layer including layers 522, 526, which sandwich a Ru layer 524, an insulating barrier layer 520, which is thin enough to allow electrons to tunnel through, and a free layer (H) 518. Thus, the free layer (I) 514 of the SV element 502 is magnetostatically coupled to the free layer (H) 518 of the MTJ element. The SV element 502 and the MTJ element 530 of the magnetic element 500 are coupled together with a separation layer 516.

Although placing the spin transfer element (e.g., 304 in FIG. 3; 402 in FIG. 4; and 502 in FIG. 5) in series with an MTJ element (e.g., 308 in FIG. 3; 422 in FIG. 4; and 530 in FIG. 5) can increase output signal and lower operating current, this mode of operation also presents a limitation. For example, in the configuration shown in FIG. 5, the write current and the read current must flow through both the spin transfer element 502 and the MTJ element 530. Thus, the write current that switches the free layer 514 within the spin transfer element 502 must be small enough so that it does not damage the insulating barrier layer 520 of the MTJ element 530.

If the current (induced by the applied voltage) applied to the MTJ element 530 is too large, the applied current can cause the insulating barrier layer 520 within the MTJ element 530 to undergo breakdown, such that the insulating properties of the insulating barrier layer 520 are destroyed. The cause of this breakdown can be due to dielectric breakdown, energetic growth of existing pinholes, or both. Therefore, the operational voltage is fundamentally constrained to be below this breakdown voltage, $V_b$, and can thus limit the operational current flowing through the MTJ element 530. Furthermore, for long-term reliability of these magnetic tunnel junctions, the maximum operating voltage is constrained to be even less than $V_b$.

To prevent destruction of the tunnel junction during a write operation, the resistance area product, RA, is subject to the following criteria: $RA < V_b/J_{st}$, where $J_{st}$ is the current density at which spin transfer causes magnetization reversal. Thus, using typical values of $J_{st}$ equal to about 0.2 A/$\mu m^2$ and $V_b$ equal to about 0.3 V for low resistance barriers, the resistance area product RA is required to be less than 1.5 $\Omega$-$\mu m^2$. Those who are skilled in the art of low resistance MTJ barrier and low RA barriers, will know that this is difficult to accomplish in a manufacturable environment.

Also due to the limitations of current low RA barriers, the dR/R will most likely be low, at less than 15%. Furthermore, the resistance of a device manufacturable with near term lithography limitations dictates that the resistance would also be low, at less than 200 $\Omega$. This would be smaller than the selection transistor resistance, thus increasing read access time. However, as the spin transfer switching current is reduced these issues become lessened because higher resistance MTJ insulating barriers could be used.

Finally, even if the switching current is reduced such that the device could be reliably switched with a spin transfer current without destroying the MTJ barrier, there is still another problem. In order to ensure that the read current does not also write the device, the read current is preferably constrained to be some small fraction of the write current. For example, a resistance of the MTJ barrier at approximately 5 k$\Omega$ and a write voltage of 0.5 V produces a write current of 0.1 mA. Although the ratio of read current to write current will depend on write current distributions, assume for this example that the read current is constrained to be three times smaller than the write current. Constraining the read current to $I_r < (I_w/3)$ results in $I_r$ being approximately 0.033 mA. This then constrains $V_r$ to approximately 0.5V/3, which results in approximately 166 mV. Assuming a dR/R of about 30%, the read signal produces only about 50 mV. Using a single MTJ element, this signal could only be increased by narrowing the read-write margins or increasing the breakdown voltage of the barrier material.

To obviate the above-described difficulties, the spin transfer driven magnetostatically coupled concept can be adapted, such that the MTJ element and the spin transfer element are separated with a lead architecture. In this lead architecture, in addition to a top electrical contact and a bottom electrical contact, a middle electrical contact is provided between the MTJ element and the spin transfer element.

Figure 6:
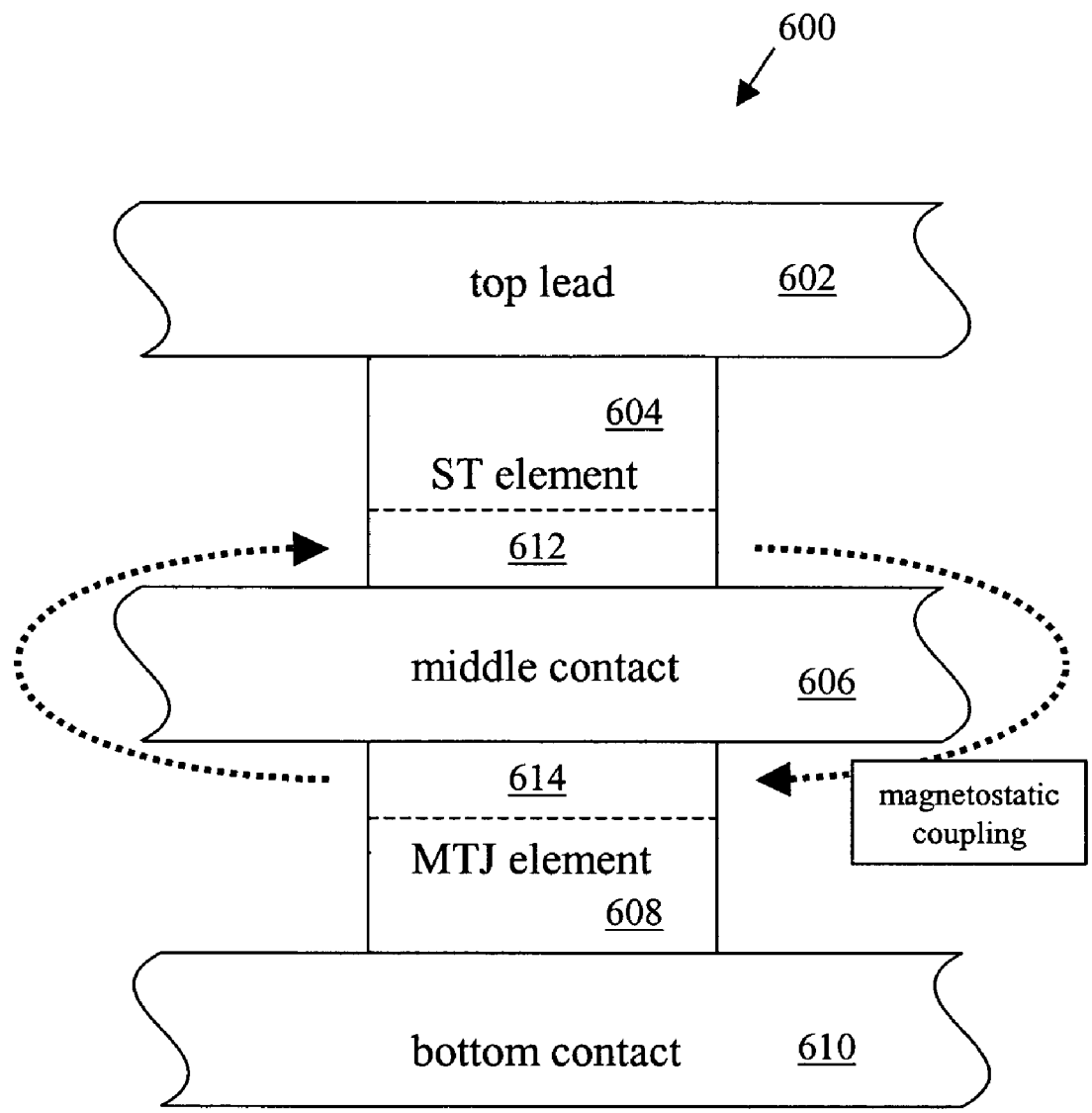
FIG. 6 illustrates a magnetic memory device with a lead architecture that includes at least three electrical contacts or terminals.

FIG. 6 illustrates a magnetic memory device 600 with the above-described lead architecture in accordance with an embodiment of the present invention. The illustrated magnetic memory device 600, which reads and writes a data state, includes at least three electrical contacts or terminals, including a top lead 602, a middle contact 606, and a bottom contact 610. The magnetic memory device 600 also includes a spin transfer (ST) driven element 604 disposed between the top lead 602 and the middle contact 606, and a readout element 608 disposed between the middle contact 606 and the bottom contact 610. In the illustrated embodiment of FIG. 6, the ST driven element 604 is configured as a spin valve, while the readout element 608 is configured as a magnetic tunnel junction (MTJ).

The ST driven element 604 includes a first free layer 612, while the readout element includes a second free layer 614. The spin torque from the applied current causes magnetization reversal of the first free layer 612 within the ST driven element 604. In turn, the magnetic field from the first free layer 612 couples magnetostatically with the second free layer 614 within the MTJ readout element 608. The second free layer 614 in the MTJ readout element 608 responds to this field and undergoes magnetization reversal, thus changing the state of the data. Therefore, during operation of the magnetic memory device 600, a write operation can utilize the ST driven element 604 to store the data state by enabling the first free layer 612 to magnetostatically interact with the second free layer 614. A read operation involves indicating a data state by detecting a magnetization direction of the second free layer in the readout element 608. With this arrangement, and a suitable logic drive circuitry, current can be forced to travel through the ST driven element 604, the readout element 608, or both.

Figure 7:
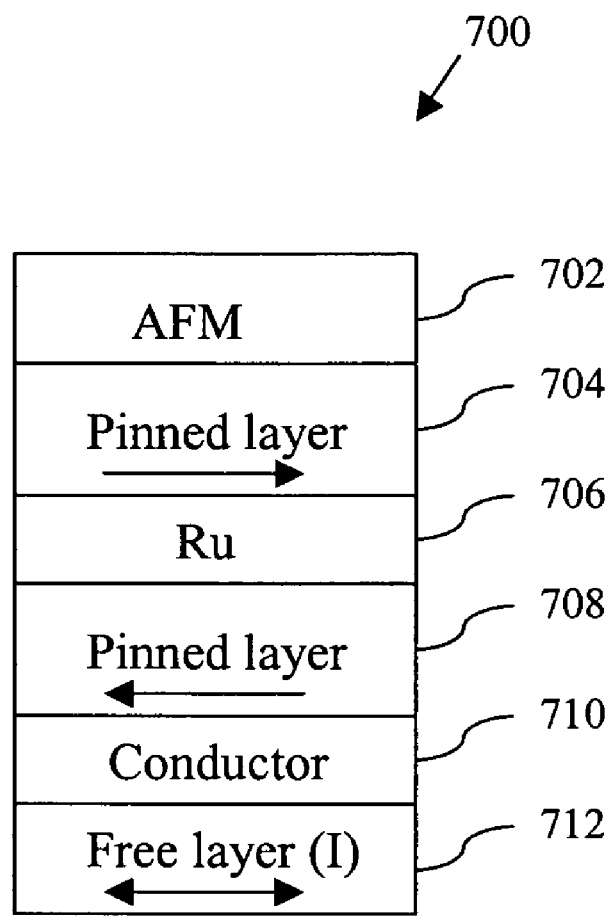
FIG. 7 shows an embodiment of an ST driven element configured as a spin valve.
Figure 8:
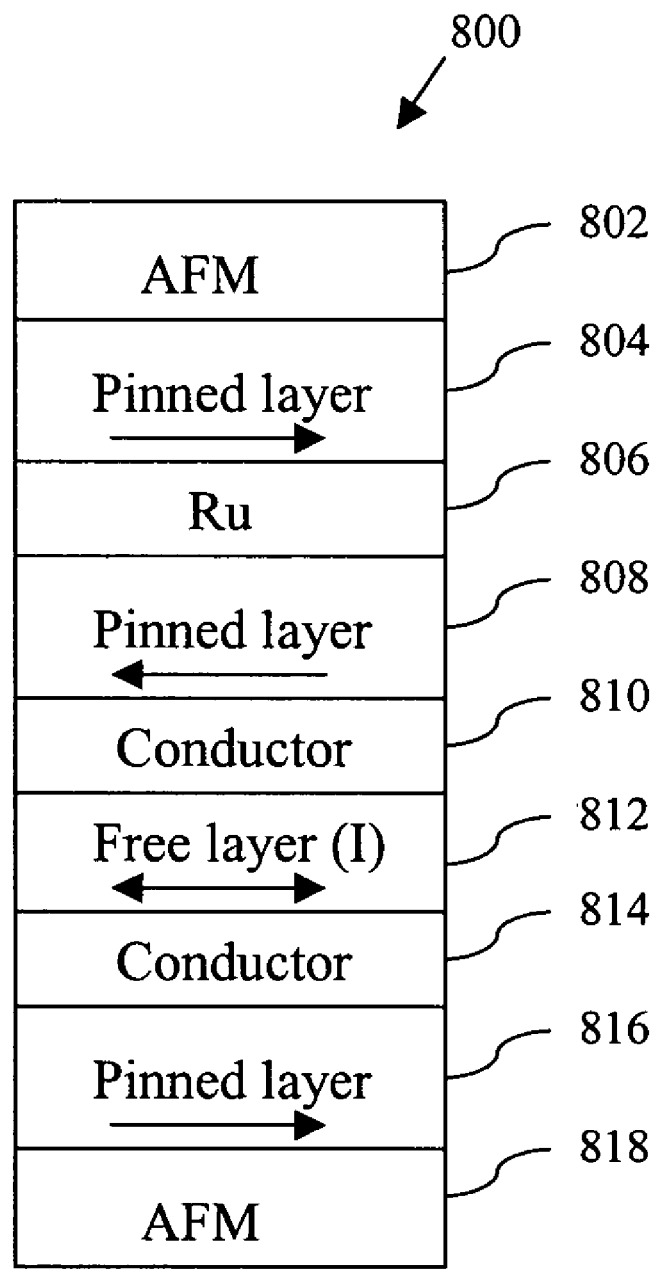
FIG. 8 shows another embodiment of an ST driven element configured as a dual spin valve.

FIG. 7 and FIG. 8 illustrate two embodiments of an ST driven element 604 shown in FIG. 6. FIG. 7 shows an embodiment of the ST driven element configured as a spin valve 700, which includes an anti-ferromagnetic (AFM) layer 702, a synthetic pinned layer that includes ferromagnetic layers 704 and 708 sandwiching a Ru layer 706, a spacer conductor layer 710, and a free layer (I) 712. FIG. 8 shows another embodiment of the ST driven element configured as a dual spin valve 800 for lower switching current. The dual spin valve 800 includes a first anti-ferromagnetic (AFM) layer 802, first and second pinned layers 804, 808, which sandwich an Ru layer of pressed material 806, a first spacer conductor layer 810, and a free layer (I) 812. The dual spin valve 800 further includes a second spacer conductor layer 814, a third pinned layer 816, and a second AFM layer 818.

Figure 9:
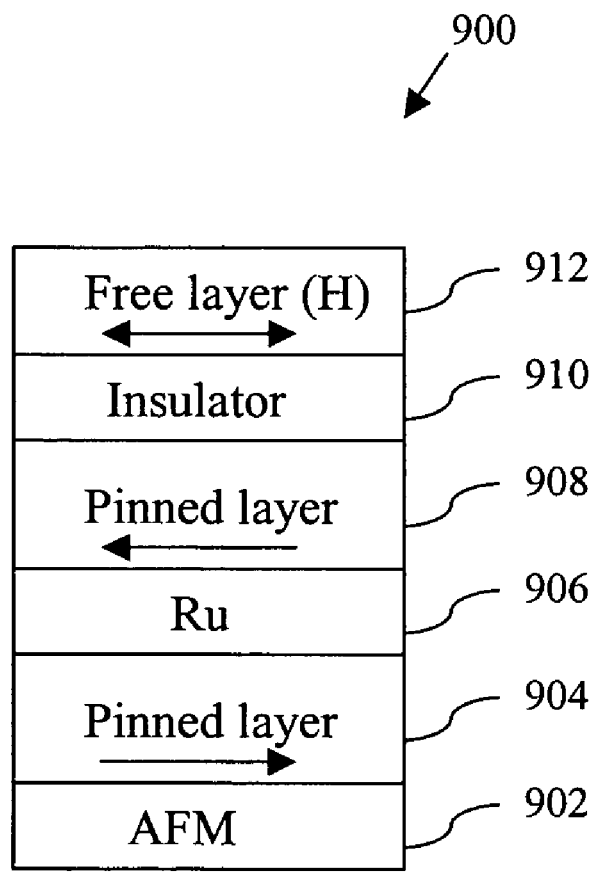
FIG. 9 shows an embodiment of a readout element configured as a magnetic tunnel junction (MTJ).
Figure 10:
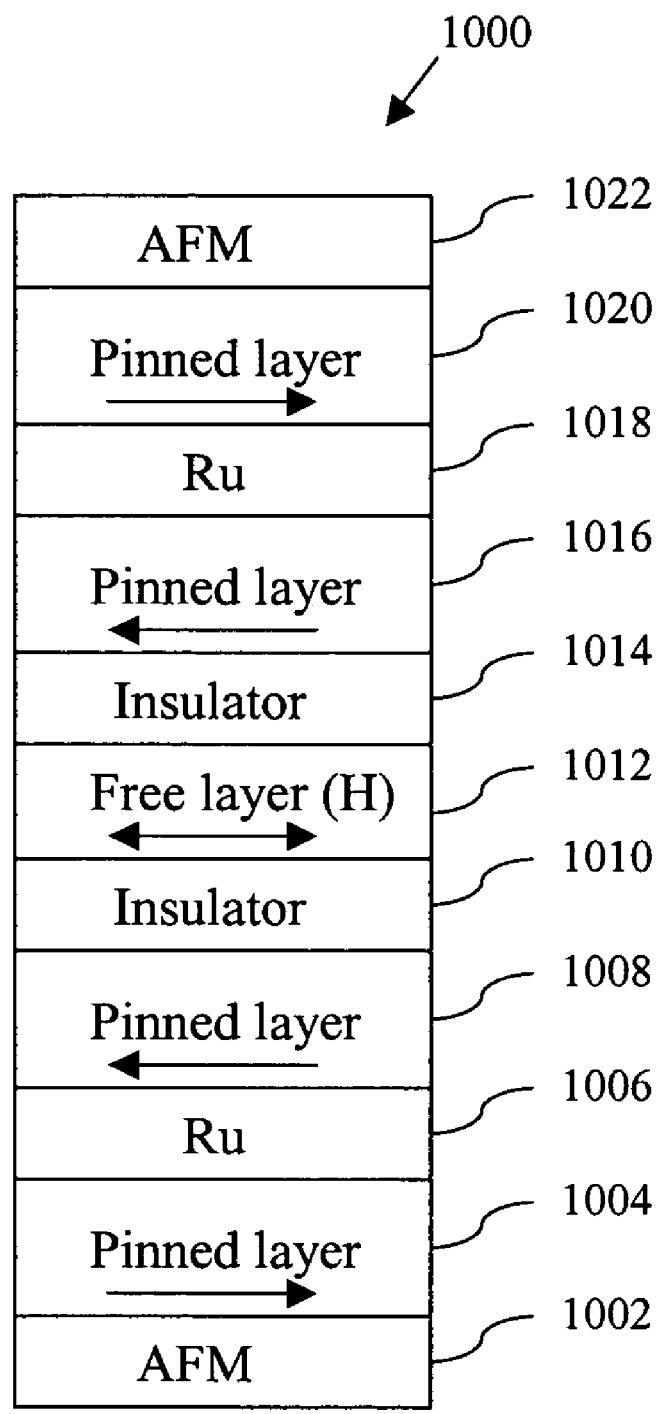
FIG. 10 shows another embodiment of a readout element configured as a dual magnetic tunnel junction (MTJ).
Figure 11:
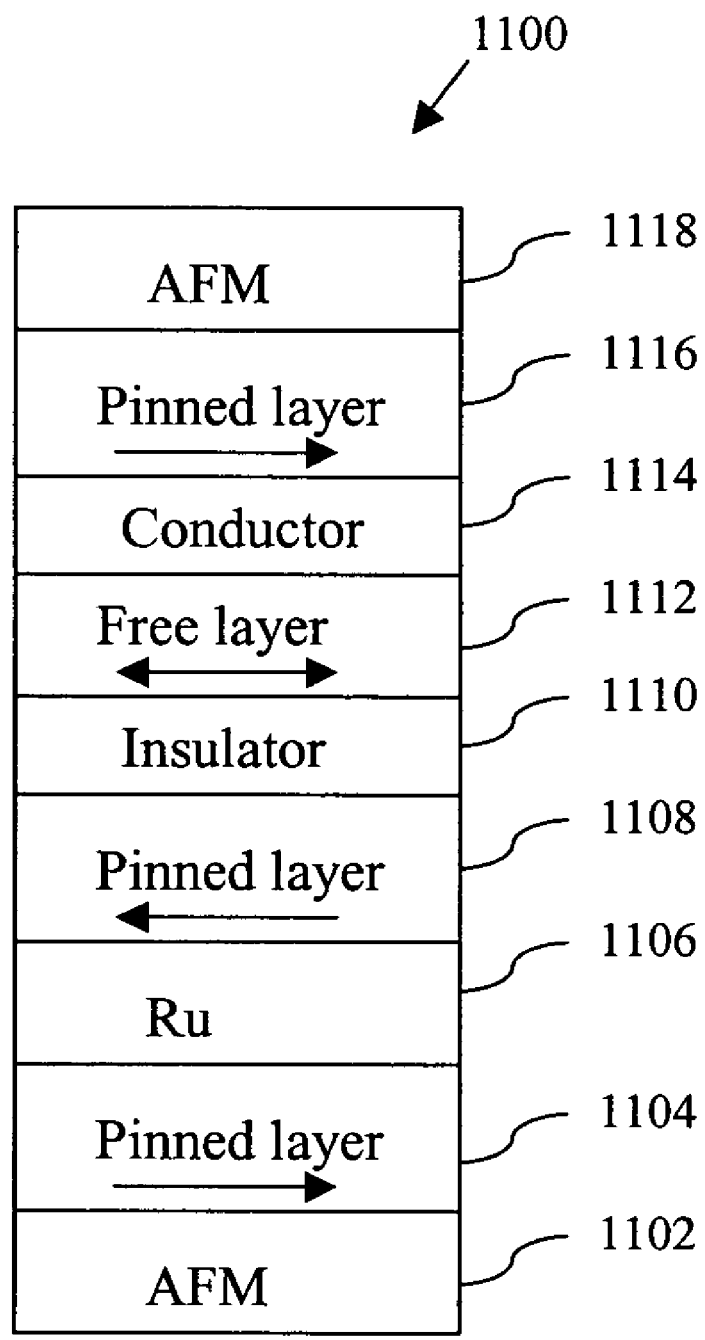
FIG. 11 shows another embodiment of a readout element configured as a dual magnetic tunnel junction (MTJ)/spin valve (SV) combination.

FIGS. 9 through 11 illustrate various embodiments of a readout element 608 shown in FIG. 6. FIG. 9 shows an embodiment of the readout element configured as a magnetic tunnel junction (MTJ) 900, which includes an anti-ferromagnetic (AFM) layer 902, a synthetic pinned layer that includes ferromagnetic layers 904 and 908 sandwiching a Ru layer 906, an insulating barrier layer 910, and a free layer (H) 912.

FIG. 10 shows another embodiment of the readout element configured as a dual MTJ 1000 for higher signal. The dual MTJ 1000 includes a first AFM layer 1002, a synthetic pinned layer that includes first and second ferromagnetic layers 1004 and 1008 sandwiching a Ru layer 1006, a first insulating barrier layer 1010, and a free layer (H) 1012. The dual MTJ 1000 further includes a second insulating layer 1014, a synthetic pinned layer that includes third and fourth ferromagnetic layers 1016 and 1020 sandwiching a Ru layer 1018, and a second AFM layer 1022.

FIG. 11 shows another embodiment of the readout element configured as a dual magnetic tunnel junction (MTJ)/spin valve (SV) combination 1100 for lower switching current. The dual MTJ/SV combination 1100 includes a first AFM layer 1102, a synthetic pinned layer that includes first and second ferromagnetic layers 1104 and 1108 sandwiching a Ru layer 1106, an insulating barrier layer 1110, and a free layer 1112. The dual MTJ/SV combination 1100 further includes a spacer conductor layer 1114, a third pinned layer 1116, and a second AFM layer 1118.

Referring back to FIG. 6, the configuration of the magnetic memory device 600, such that the write current is forced to follow a different path than the read current, allows the satisfactory resolution of the issues with breakdown voltage and low read signal. For example, the write current can be forced through the ST driven element 604 via the middle contact 606 and into the top contact 602, circumventing the MTJ element 608. Thus, the large write current does not flow through the MTJ readout element 608 and therefore cannot cause damage to the sensitive insulating barrier layer of the MTJ readout element 608. Furthermore, the maximum voltage that long-term reliability allows can be applied to the MTJ readout element 608 for the read operation.

A suitable selection circuitry can be employed such that the read current does not flow through the ST driven element 604 to prevent the possibility of accidental writing during the read operation. Alternatively, the read current can flow through both the ST driven element 604 and the MTJ readout element 608. In the latter case, the resistance of the MTJ readout element 608 must be carefully chosen such that the read current does not cause spin transfer driven magnetization reversal of the free layer in the ST driven element 604. In such a case, the read current must be constrained to be $$I_{read} < (I_{write}/x), \quad [1]$$

where x is some scaling factor that depends on the write distributions. Since $$I_{read} \sim V_{read}/R_{MTJ}, \quad [2]$$

combining Equations [1] and [2]:

$$R_{MTJ} > (V_{read}*x)/I_{write} \quad [3]$$

Applying some reasonable values of $V_{read} \sim 0.2$ V, $I_{write} \sim 0.2$ mA, and $x \sim 3$, into Equation [3] yields $R_{MTJ}$ greater than 3 kΩ, which is a reasonable value of the resistance of an MTJ element.

Referring to FIG. 6 again, an isolation circuitry is required to select a single element, such as the magnetic memory device 600, from within a dense array of magnetic elements. FIGS. 12 through 16 represent four different embodiments configured to provide this selection from a dense array.

Figure 12:
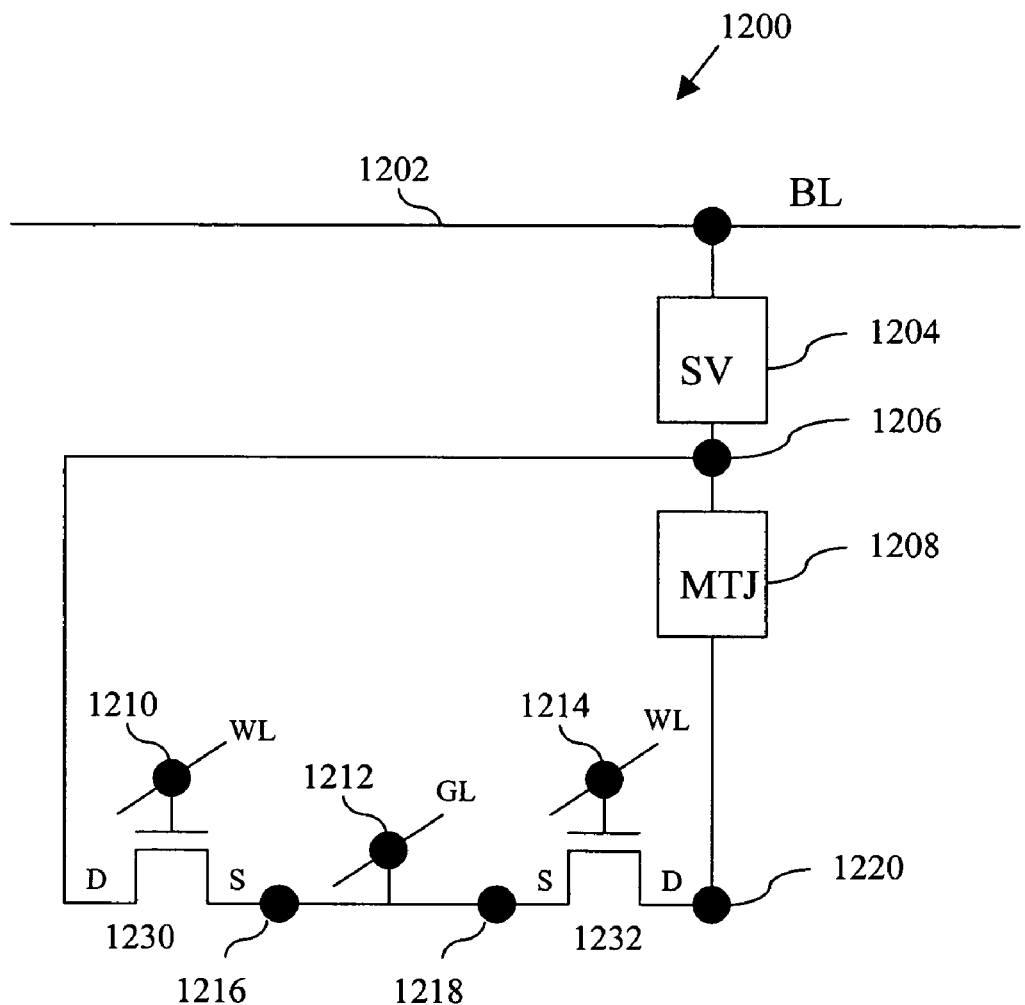
FIG. 12 illustrates a 3-terminal device structure cell using two transistors per cell for isolation and selection, in accordance with an embodiment of the present invention.

In the first illustrated embodiment of FIG. 12, the 3-terminal device structure cell 1200 uses two transistors 1230, 1232 per cell for isolation and selection. One transistor 1230 is connected to the spin transfer element (i.e., the spin valve) 1204 through the middle contact 1206 while another transistor 1232 is connected to the MTJ readout element 1208 through the bottom contact 1220.

A write operation includes sending a current pulse through the bridging middle contact 1206, and then through the spin transfer element 1204. This can be achieved by applying a voltage along the Word Line (WL) 1210 and another voltage along the Bit Line (BL) 1202. The transistor source 1216 is grounded via Ground Line (GL) 1212.

A read operation includes sending a current pulse through the MTJ element 1208 and then through the spin transfer element 1204. This can be achieved by applying a voltage along WL 1214 and another voltage along BL 1202. The transistor source 1218 is grounded via GL 1212. As the read current flows through both the MTJ readout element 1208 and the spin transfer element 1204, the resistance of the MTJ readout element 1208 must be carefully chosen such that the read current does not also write the device 1200.

Figure 13:
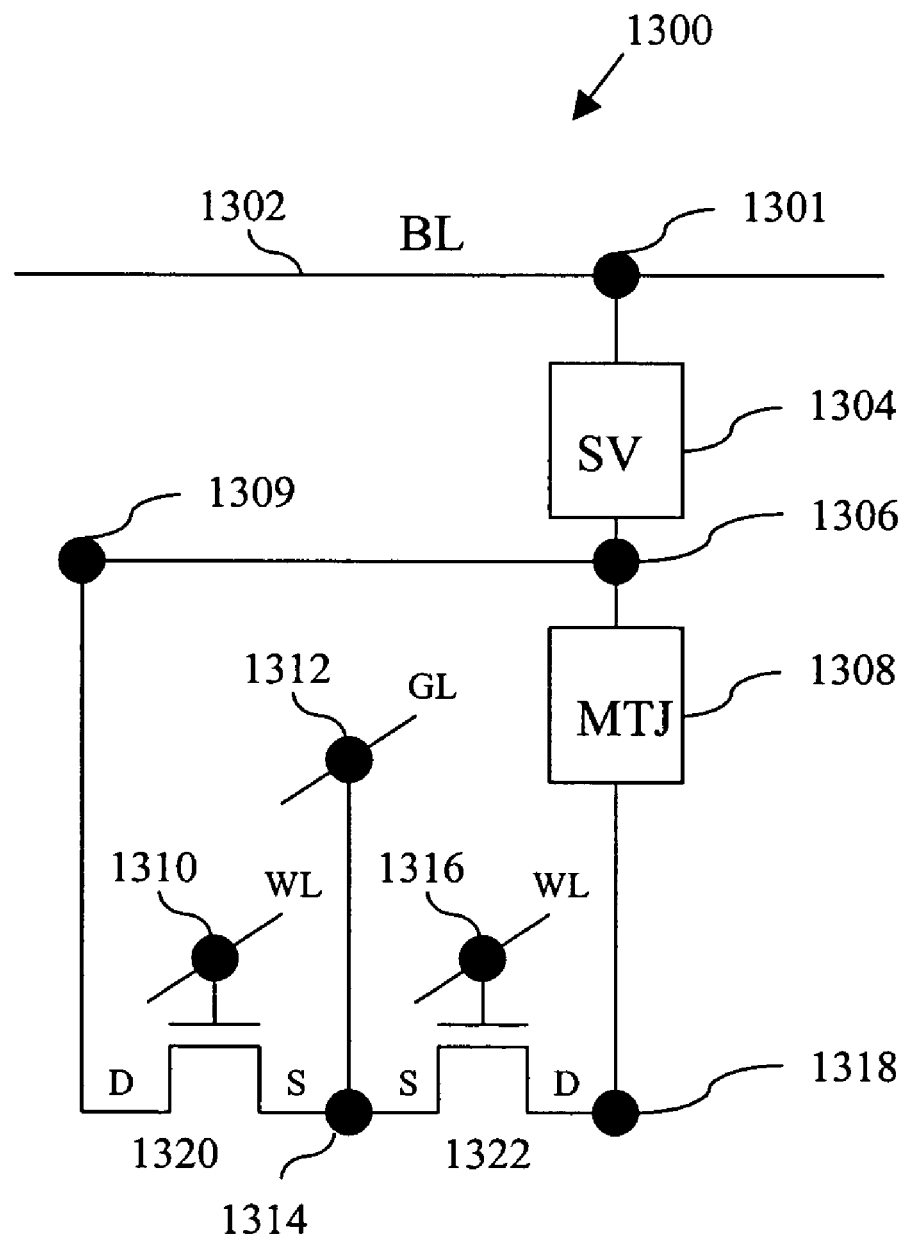
FIG. 13 illustrates a 3-terminal device structure cell using two transistors per cell for isolation and selection, in accordance with another embodiment of the present invention.
Figure 14:
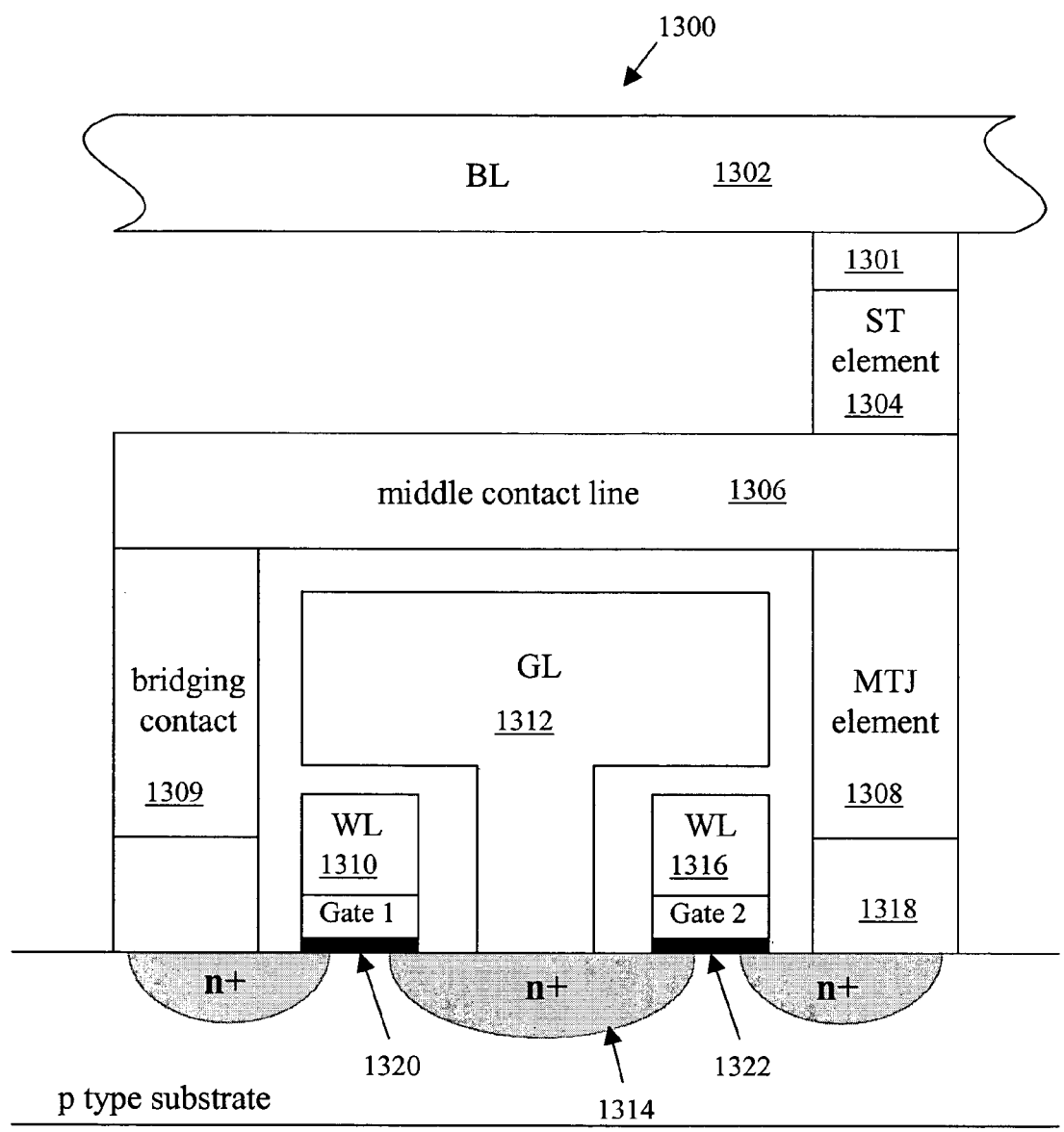
FIG. 14 illustrates the embodiment shown in FIG. 13 in a structural layout.

The second embodiment, illustrated in FIG. 13 and FIG. 14, is a refinement of the first embodiment. The memory cell 1300 includes two transistors 1320, 1322 that share a common source 1314 for isolation. For example, the two transistor series would include a drain/gate/shared source/gate/drain instead of a drain/gate/source/isolation/source/gate/drain. The transistor 1320 is connected to the spin transfer element (i.e., the spin valve) 1304 through the middle contact 1306, while the transistor 1322 is connected to the MTJ readout element 1308 through the bottom contact 1318. The BL 1302 is connected to the top contact 1301. The shared source 1314 is connected to GL 1312.

FIG. 14 illustrates the second embodiment in a structural layout with like numbers designating the like elements in FIG. 13. Thus, a write operation includes sending a current pulse through the bridging contact 1309, through a middle contact 1306, and then through the spin transfer element 1304. This can be achieved by applying a voltage along WL 1310 as well as a voltage on BL 1302, while grounding GL 1312 and the shared transistor source 1314.

A read operation includes sending a current pulse through the MTJ element 1308 and then through the spin transfer element 1304. This can be achieved by applying a voltage along WL 316 as well as a voltage on the BL 1302, while grounding GL 1312. As the read current flows through both the MTJ readout element 1308 and the spin transfer element 1304, the resistance of the MTJ readout element 1308 must be carefully chosen such that the read current does not also write the device 1300.

Figure 15:
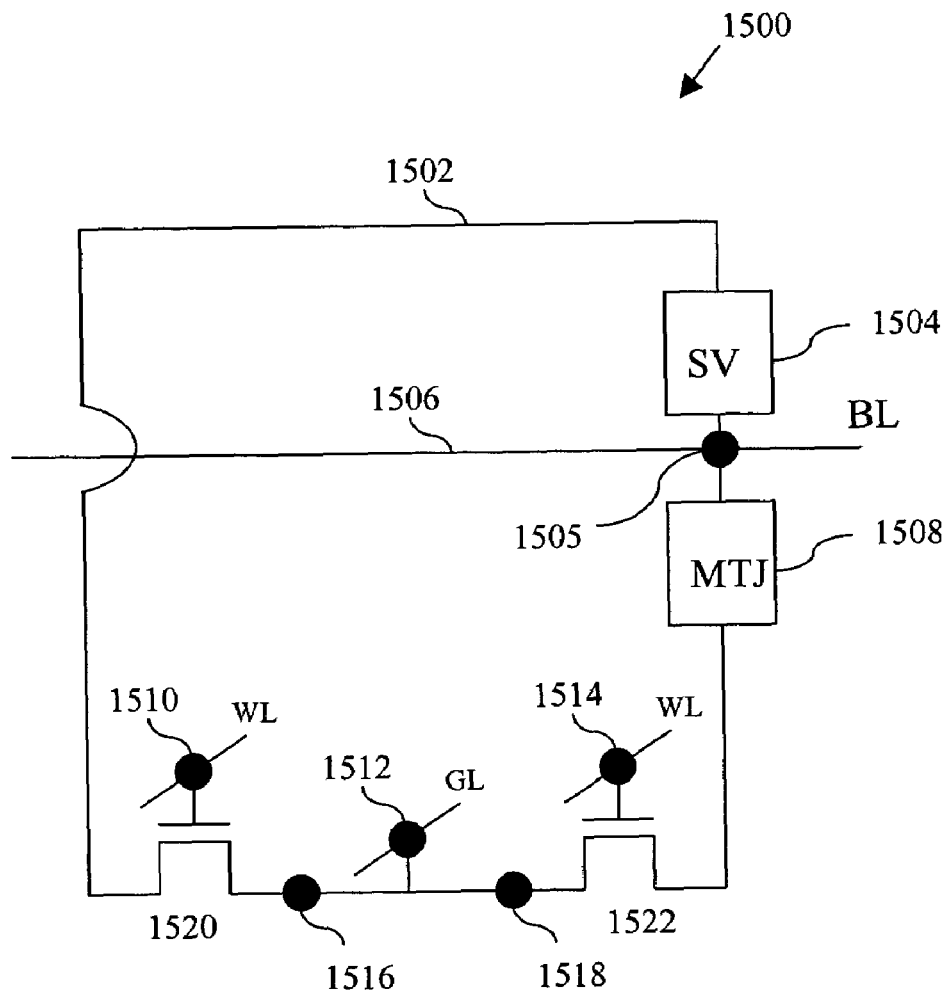
FIG. 15 illustrates a 3-terminal device structure cell using two transistors per cell for isolation and selection, in accordance with another embodiment of the present invention.

A third embodiment, illustrated in FIG. 15, uses two transistors 1520, 1522 per cell 1500 for isolation and selection. However, the middle contact line 1505 is used as the bit line BL 1506. In this configuration, the write current can be directed solely through the spin transfer element 1504, and the read current can be directed solely through the MTJ readout element 1508. Thus, the resistance of the MTJ element 1508 does not need to be tailored such that the read current is limited to be smaller than the write current.

A write operation includes sending a current pulse through the bit line 1506, through the transistor 1520 connected directly to the spin transfer element 1504, through the spin transfer element 1504, and then out to the ground line GL 1506. This can be achieved by applying a voltage along the gate WL 1510 of the transistor 1520 as well as a voltage on BL 1506, while grounding GL 1512. A read operation includes sending a current pulse through the MTJ element 1508. This can be achieved by applying a voltage along the BL 1506 as well as a voltage on WL 1514, while grounding GL 1512.

Figure 16:
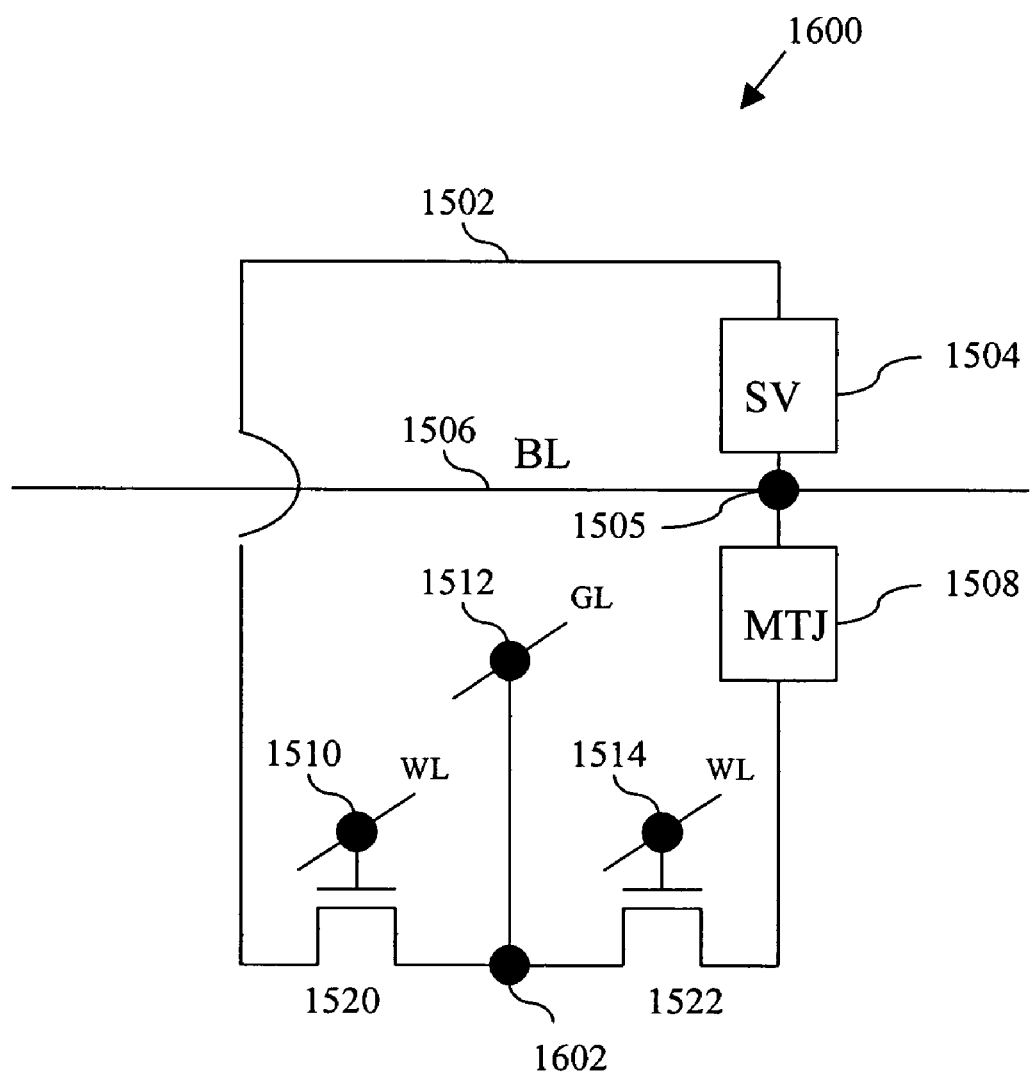
FIG. 16 illustrates a 3-terminal device structure cell using two transistors per cell for isolation and selection, in accordance with another embodiment of the present invention.

Finally, the fourth embodiment, illustrated in FIG. 16, is a refinement of the third embodiment. In the fourth embodiment, the two transistors 1520, 1522 from the third embodiment share a common source 1602. For example, the two transistor series 1520, 1522 would include a drain/gate/shared source/gate/drain instead of a drain/gate/source/isolation/source/gate/drain. The shared source 1602 is connected to a single ground line GL 1512.

The present invention has been described above in terms of exemplary embodiments so that an understanding of the present invention can be conveyed. Any embodiment described herein as "exemplary" is not necessarily to be construed as preferred or advantageous over other embodiments. Moreover, there are many configurations for the magnetic memory device and associated components or elements not specifically described herein but with which the present invention is applicable. The present invention should therefore not be seen as limited to the particular embodiments described herein, but rather, it should be understood that the present invention has wide applicability with respect to magnetic memory device generally. All modifications, variations, or equivalent arrangements and implementations that are within the scope of the attached claims should therefore be considered within the scope of the invention.

We claim:

1. A magnetic memory device, comprising:
   at least three terminals including first, second, and third terminals;
   a spin transfer (ST) driven element including a first free layer, the ST driven element disposed between the first terminal and the second terminal; and
   a readout element including a second free layer, the readout element disposed between the second terminal and the third terminal,
   wherein magnetization direction of the second free layer in the readout element indicates a data state, and
   wherein a magnetization reversal of the first free layer within the ST driven element magnetostatically causes a magnetization reversal of the second free layer in the readout element, thereby recording the data state.

2. A magnetic memory device as defined in claim 1, wherein the ST driven element includes a spin valve (SV).

3. A magnetic memory device as defined in claim 2, wherein the SV is a current perpendicular to the plane (CPP) spin valve.

4. A magnetic memory device as defined in claim 2, wherein the spin valve comprises:
   an anti-ferromagnetic (AFM) layer;
   a pinned layer;
   a conductor layer; and
   the first free layer.

5. A magnetic memory device as defined in claim 4, wherein the pinned layer is synthetic and includes:
   a first pinned sub-layer;
   a second pinned sub-layer;
   a Ru layer sandwiched between the first and second pinned sub-layers, wherein the Ru layer promotes anti-ferromagnetic exchange coupling between the first and second pinned sub-layers.

6. A magnetic memory device as defined in claim 1, wherein the ST driven element includes a dual spin valve.

7. A magnetic memory device as defined in claim 6, wherein the dual spin valve comprises:
   a first anti-ferromagnetic (AFM) layer;
   a first pinned layer;
   a first conductor layer;
   the first free layer;
   a second conductor layer;
   a second pinned layer; and
   a second anti-ferromagnetic (AFM) layer.

8. A magnetic memory device as defined in claim 7, wherein the second pinned layer is synthetic and includes:
   a first pinned sub-layer;
   a second pinned sub-layer;
   a Ru layer sandwiched between the first and second pinned sub-layers, wherein the Ru layer sandwiched between the first and second pinned sub-layers, wherein the Ru layer promotes anti-ferromagnetic exchange coupling between the first and second pinned sub-layers.

9. A magnetic memory device as defined in claim 1, wherein the readout element includes a magnetic tunnel junction (MTJ).

10. A magnetic memory device as defined in claim 9, wherein the MTJ comprises:
    an anti-ferromagnetic (AFM) layer;
    a pinned layer;
    an insulating barrier layer; and
    the second free layer.

11. A magnetic memory device as defined in claim 1, wherein the readout element includes a dual magnetic tunnel junction (MTJ).

12. A magnetic memory device as defined in claim 11, wherein the dual MTJ comprises:
    a first anti-ferromagnetic (AFM) layer;
    a first pinned layer;
    a first insulating barrier layer;
    the second free layer;
    a second insulating barrier layer;
    a second pinned layer; and
    a second anti-ferromagnetic (AFM) layer.

13. A magnetic memory device as defined in claim 1, wherein the readout element includes a magnetic tunnel junction (MTJ)/spin valve (SV) combination.

14. A magnetic memory device as defined in claim 13, wherein the MTJ/SV combination comprises:
   a first anti-ferromagnetic (AFM) layer;
   a first pinned layer;
   an insulating barrier layer;
   the second free layer;
   a conductor layer;
   a second pinned layer; and
   a second anti-ferromagnetic (AFM) layer.

15. A magnetic memory device as defined in claim 14, wherein the second pinned layer is synthetic and includes:
   a first pinned sub-layer;
   a second pinned sub-layer;
   a Ru layer sandwiched between the first and second pinned sub-layers,
wherein the Ru layer promotes anti-ferromagnetic exchange coupling between the first and second pinned sub-layers.

16. An array of magnetic memory devices for reading and writing data states, comprising:
   a plurality of word lines;
   a plurality of bit lines; and
   a plurality of magnetic memory elements, each magnetic memory element comprising:
      at least three terminals including first, second, and third terminals;
      a spin transfer (ST) driven element including a first free layer, the ST driven element disposed between the first terminal and the second terminal;
      a readout element including a second free layer and an insulating barrier layer, the readout element disposed between the second terminal and the third terminal; and
      at least one isolation circuitry configured to select a desired magnetic memory element within the array, and to isolate the insulating barrier layer during a write operation,
   wherein the readout element, the word line, and the bit line cooperate to enable a magnetization direction of the second free layer in the readout element to indicate a data state, and
   wherein the ST driven element, the word line, and the bit line cooperate to enable a magnetization reversal of the first free layer within the ST driven element magnetostatically causing a magnetization reversal of the second free layer in the readout element thereby recording a data state.

17. An array of magnetic memory devices as defined in claim 16, wherein said at least one isolation circuitry comprises:
   a first gate, a first source, and a first drain; and
   a second transistor having a second gate, a second source, and a second drain.

18. An array of magnetic memory devices as defined in claim 17, wherein said at least one isolation circuitry and said at least three terminals are configured such that
   the first terminal is coupled to the bit line,
   the second terminal is coupled to the first drain,
   the third terminal is coupled to the second rain, and
   the first and second sources are coupled to the ground line.

19. An array of magnetic memory devices as defined in claim 18, wherein the first and second transistors are configured such that
   during the write operation, current flows from the bit line through the ST driven element, through the first transistor, and into the ground line, and
   during the read operation, current flows from the bit line through the readout element, through the ST driven element, through the second transistor, and into the ground line.

20. An array of magnetic memory devices as defined in claim 17, wherein said at least one isolation circuitry and said at least three terminals are configured such that
   the first terminal is coupled to the first drain,
   the second terminal is coupled to the bit line,
   the third terminal is coupled to the second drain, and
   the first and second sources are coupled to the ground line.

21. An array of magnetic memory devices as defined in claim 20, wherein the first and second transistors are configured such that
   during the write operation, current flows from the bit line through the ST driven element, through the first transistor, and into the ground line, and
   during the read operation, current flows from the bit line through the readout element, through the second transistor, and into the ground line.

22. A method for reading and writing a data state fro a magnetic memory device, comprising:
   providing at least three terminals including first, second, and third terminals;
   providing a spin transfer (ST) driven element including a first free layer, the ST driven element disposed between the first terminal and the second terminal;
   providing a readout element including a second free layer, the readout element disposed between the second terminal and the third terminal;
   reversing a magnetization direction of the first free layer within the ST driven element, and magnetostatically causing a magnetization reversal of the second free layer in the readout element to record a data state; and
   indicating a data state by detecting a magnetization direction of the second free layer in the readout element.

23. A method as defined in claim 22, wherein reversing a magnetization direction includes applying a voltage between the second terminal and the first terminal.

24. A method as defined in claim 22, wherein indicating a data state includes applying a voltage between the third terminal and the first terminal.

25. A method as defined in claim 22, wherein indicating a data state includes applying a voltage between the third terminal and the second terminal.

26. A method for reading and writing data states for an array of magnetic memory elements, comprising:
   providing a plurality of word lines;
   providing a plurality of bit lines;
   providing a plurality of magnetic memory elements, each magnetic memory element comprising:
      at least three terminals including first, second, and third terminals;
      a spin transfer (ST) driven element including a first free layer, the ST driven element disposed between the first terminal and the second terminal;
      a readout element including a second free layer and an insulating barrier layer, the readout element disposed between the second terminal and the third terminal; and
      at least one isolation circuitry configured to select a desired magnetic memory element within the array, and to isolate the insulating barrier layer during a write operation;

reversing a magnetization direction of the first free layer within the ST driven element, and magnetostatically causing a magnetization reversal of the second free layer in the readout element to record a data state; and indicating a data state by detecting a magnetization direction for the second free layer in the readout element.

27. A method as defined in claim 26, wherein said at least one isolation circuitry comprises:

a first transistor having a first gate, a first source, and a first drain; and a second transistor having a second gate, a second source, and a second drain.

28. A method as defined in claim 27, further comprising: configuring said at least one isolation circuitry and said at least three terminals, including:

connecting the first terminal to the bit line;
connecting the second terminal to the first drain;
connecting the third terminal to the second drain; and
connecting the first and second sources to the ground line.

29. A method as defined in claim 28, further comprising: configuring the first and second transistors, including:

directing the current to flow from the bit line through the ST driven element, through the first transistor, and into the ground line, to write the data state; and directing current to flow from the bit line through the readout element, through the ST driven element, through the second transistor, and into the ground line, to read the data state.

30. A method as defined in claim 27, further comprising:

configuring said at least one isolation circuitry and said at least three terminals, including:

coupling the first terminal to the first drain;
coupling the second terminal to the bit line;
coupling the third terminal to the second drain; and
coupling the first and second sources to the word line.

31. A method as defined in claim 30, further comprising:

configuring the first and second transistors, including:

directing current to flow from the bit line through the ST driven element, through the first transistor, and into the ground line, to write the data state; and directing current to flow from the bit line through the readout element, through the second transistor, and into the ground line to read the data state.

* * * * *